(12) United States Patent
Freyensee et al.

(10) Patent No.: US 7,464,016 B2
(45) Date of Patent: Dec. 9, 2008

(54) HOT PLUG AND HOT PULL SYSTEM SIMULATION

(75) Inventors: James P. Freyensee, Los Altos, CA (US); Carl Cavanagh, Oakland, CA (US); Steven A. Sivier, Fremont, CA (US); Carl B. Frankel, San Francisco, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 1491 days.

(21) Appl. No.: 10/008,271

(22) Filed: Nov. 9, 2001

(65) Prior Publication Data

US 2003/0093255 A1     May 15, 2003

(51) Int. Cl.
*G06F 17/50* (2006.01)
*G06F 13/00* (2006.01)

(52) U.S. Cl. .............................. 703/20; 703/25; 703/27; 709/223; 710/302

(58) Field of Classification Search .................... 703/13, 703/20, 22, 25, 27; 710/302; 709/223; 714/12
See application file for complete search history.

(56) References Cited

U.S. PATENT DOCUMENTS

| | | | |
|---|---|---|---|
| 4,456,994 A | 6/1984 | Segarra | |
| 4,590,581 A | 5/1986 | Widdoes, Jr. | |
| 4,821,173 A | 4/1989 | Young et al. | |
| 4,937,173 A | 6/1990 | Kanda et al. | |
| 5,185,865 A | 2/1993 | Pugh | |
| 5,247,650 A | 9/1993 | Judd et al. | |
| 5,317,693 A * | 5/1994 | Cuenod et al. | 710/9 |
| 5,327,361 A | 7/1994 | Long et al. | |
| 5,339,435 A | 8/1994 | Lukin et al. | |
| 5,398,317 A | 3/1995 | Nugent | |
| 5,442,772 A | 8/1995 | Childs et al. | |
| 5,455,928 A | 10/1995 | Herlitz | |
| 5,466,200 A | 11/1995 | Ulrich et al. | |
| 5,519,848 A | 5/1996 | Wloka et al. | |
| 5,625,580 A | 4/1997 | Read et al. | |
| 5,634,010 A | 5/1997 | Ciscon et al. | |

(Continued)

OTHER PUBLICATIONS

"Rule Base Driven Conversion of an Object Oriented Design Structure Into Standard Hardware Description Languages," Verschueren, A.C., IEEE Xplore, appears in Euromicro Conference, 1998, Proceedings. 24th, vol. 1, Aug. 25, 1998, pp. 42-45.

"Modeling Communication with Objective VHDL," Putzke, et al., IEEE Xplore, appears in Verilog HDL Conference and VHDL International Use Forum, 1998, IVC/VIUF, Proceedings., 1998 International, Mar. 16, 1998, pp. 83-89.

(Continued)

*Primary Examiner*—Thai Phan
(74) *Attorney, Agent, or Firm*—Lawrence J. Merkel; Meyertons, Hood, Kivlin, Kowert & Goetzel, P.C.

(57) ABSTRACT

In one embodiment, a distributed simulation system may include a first node configured to participate in a simulation and a second node configured to transmit a hot pull command designating the first node. The first node does not participate in the simulation responsive to the hot pull command. In another embodiment, A distributed simulation system may include a first node configured to participate in a simulation and a second node configured to transmit a hot plug command designating the first node. The first node does not participate in the simulation prior to the hot plug command. Additionally, the first node begins participation in the simulation responsive to the hot plug command.

32 Claims, 13 Drawing Sheets

U.S. PATENT DOCUMENTS

| | | | |
|---|---|---|---|
| 5,640,546 A * | 6/1997 | Gopinath et al. | 713/400 |
| 5,715,184 A | 2/1998 | Tyler et al. | |
| 5,732,247 A | 3/1998 | Dearth et al. | |
| 5,751,941 A | 5/1998 | Hinds et al. | |
| 5,794,005 A | 8/1998 | Steinman | |
| 5,812,824 A | 9/1998 | Dearth et al. | |
| 5,838,948 A | 11/1998 | Bunza | |
| 5,848,236 A | 12/1998 | Dearth et al. | |
| 5,850,345 A | 12/1998 | Son | |
| 5,870,585 A | 2/1999 | Stapleton | |
| 5,870,588 A * | 2/1999 | Rompaey et al. | 703/13 |
| 5,875,179 A | 2/1999 | Tikalsky | |
| 5,881,267 A * | 3/1999 | Dearth et al. | 703/27 |
| 5,889,954 A | 3/1999 | Gessel et al. | |
| 5,892,957 A | 4/1999 | Normoyle et al. | |
| 5,893,155 A | 4/1999 | Cheriton | |
| 5,907,685 A | 5/1999 | Douceur | |
| 5,907,695 A | 5/1999 | Dearth | |
| 5,910,903 A | 6/1999 | Feinberg et al. | |
| 5,973,638 A | 10/1999 | Robbins et al. | |
| 5,991,533 A | 11/1999 | Sano et al. | |
| 6,031,987 A | 2/2000 | Damani et al. | |
| 6,053,947 A | 4/2000 | Parson | |
| 6,117,181 A | 9/2000 | Dearth et al. | |
| 6,134,234 A | 10/2000 | Kapanen | |
| 6,188,975 B1 * | 2/2001 | Gay | 703/22 |
| 6,282,596 B1 * | 8/2001 | Bealkowski et al. | 710/302 |
| 6,289,398 B1 | 9/2001 | Stallmo et al. | |
| 6,292,931 B1 * | 9/2001 | Dupenloup | 716/18 |
| 6,345,242 B1 | 2/2002 | Dearth et al. | |
| 6,393,588 B1 * | 5/2002 | Hsu et al. | 714/43 |
| 6,449,732 B1 * | 9/2002 | Rasmussen et al. | 714/12 |
| 6,470,397 B1 * | 10/2002 | Shah et al. | 709/250 |
| 6,507,809 B1 | 1/2003 | Yoshino et al. | |
| 6,539,520 B1 * | 3/2003 | Tiong et al. | 716/3 |
| 6,625,650 B2 * | 9/2003 | Stelliga | 709/226 |
| 6,628,287 B1 * | 9/2003 | Duda et al. | 345/475 |
| 6,711,411 B1 | 3/2004 | Ruffini | |
| 6,711,645 B1 * | 3/2004 | Chari et al. | 710/302 |
| 6,748,451 B2 | 6/2004 | Woods et al. | |
| 6,880,086 B2 * | 4/2005 | Kidder et al. | 713/191 |
| 6,915,253 B1 * | 7/2005 | Chapman | 703/22 |
| 7,010,607 B1 * | 3/2006 | Bunton | 709/228 |
| 7,185,077 B1 * | 2/2007 | O'Toole et al. | 709/223 |
| 2002/0138242 A1 * | 9/2002 | Wilensky et al. | 703/13 |
| 2002/0188910 A1 * | 12/2002 | Zizzo | 716/1 |
| 2003/0005200 A1 * | 1/2003 | Kumar et al. | 710/302 |
| 2003/0037128 A1 * | 2/2003 | Beadles et al. | 709/220 |
| 2003/0056182 A1 * | 3/2003 | Rosenbaum et al. | 716/1 |
| 2003/0074177 A1 * | 4/2003 | Bowen | 703/22 |
| 2003/0093252 A1 | 5/2003 | Fankel et al. | |
| 2003/0093253 A1 | 5/2003 | Freyensee et al. | |
| 2003/0093254 A1 | 5/2003 | Frankel et al. | |
| 2003/0093255 A1 | 5/2003 | Freyensee et al. | |
| 2003/0093256 A1 | 5/2003 | Cavanagh et al. | |
| 2003/0093569 A1 | 5/2003 | Sivier et al. | |
| 2005/0066087 A1 * | 3/2005 | Wu | 710/63 |

OTHER PUBLICATIONS

"A Procedural Language Interface for VHDL and its Typical Applications," Martinolle, et al., IEEE Xplore, appears in Verilog HDL Conference and VHDL International Use Forum, 1998, IVC/VIUF, Proceedings., 1998 International, Mar. 16, 1998, pp. 32-38.

"The Verilog Procedural Interface for the Verilog Hardware Description Language," Dawson, et al., IEEE Xplore, appears in Verilog HDL Conference, 1996, Proceedings., 1996 International, Feb. 26, 1996, pp. 17-23.

"An Integrated Environment for HDL Verification," York, et al., IEEE Xplore, appears in Verilog HDL Conference, 1995, Proceedings., 1995 International, Mar. 27, 1995, pp. 9-18.

"The PowerPC 603 C++ Verilog Interface Model," Voith, R.P., IEEE Xplore, appears in Compcon Spring '94, Digest of Papters, Feb. 28, 1994, pp. 337-340.

Networked Object Oriented Verification with C++ and Verilog, Dearth, et al., IEEE, XP-002144328, 1998, 4 pages.

Patent Abstracts of Japan, publication No. 10326835, published Dec. 8, 1998.

Patent Abstracts of Japan, publication No. 10049560, published Feb. 20, 1998.

Patent Abstracts of Japan, publication No. 10340283, published Dec. 22, 1998.

Patent Abstracts of Japan, publication No. 07254008, published Oct. 3, 1995.

"Multiprocessing Verilog Simulator Exploits the Parallel Nature of HDLs." Lisa Maliniak, Electronic Design, Abstract, May 30, 1994, 1 page.

"It's A Multithreaded World, Part I," Charles J. Northrup, BYTE, May 1992, 7 pages.

"It's Multithreaded World, Part 2," Charles J. Northrup, BYTE, Jun. 1992, pp. 351-356.

"Weaving a Thread," Shashi Prasad, BYTE, Oct. 1995, pp. 173-174.

"Making Sense of Collaborative Computing," Mark Gibbs, Network World Collaboration, Jan. 10, 1994, 4 pages.

"Parallel Logic Simulation of VLSI Systems," Bailey, et al., ACM Computing Surveys, vol. 26, No. 3, Sep. 1994, pp. 255-294.

"Multithreaded Languages for Scientific and Technical Computing," Cherri M. Pancake, Proceedings of the IEEE, vol. 81, No. 2, Feb. 1993, pp. 288-304.

"Distributed Simulation Architecture, SW Environment, Enterprise Server Products," Purdue EP400 Presented by Freyensee and Frankel, Nov. 9, 2000, 13 pages.

"BNF and EBNF: What Are They And How Do They Work?," Lars Marius Garshol, Oct. 12, 1999, pp. 1-10.

"VCK: Verilog-C Kernel," Testbench Automation, Distribution by Verilog Simulation, Hardware-Software Co-verification, 2001 Avery Design Systems, Inc., 8 pages.

"Principles of Verilog PLI," Swapnajit Mittra, Silicon Graphics Incorporated, 1999, 10 pages.

"IEEE Standard Hardware Description Language Based on the Verilog® Hardware Description Language," IEEE, Dec. 12, 1995, 8 pages.

"OpenVera 1.0, Language Reference Manual," Version 1.0, Mar. 2001, pp. 4-1 to 4-34, pp. 5-1 to 5-32, 6-1 to 6-22, 7-1 to 7-24, 11-1 to 11-50, 12-1 to 12-8, 13-1 to 13-14, 14-1 to 14-20, 15-1 to 15-118.

"VLSI Designe of a Bust Arbitration Module for the 68000 Series of Microprocessors," Ososanya, et al., IEEE, 1994, pp. 398-402.

"A VHDL Standard Package for Logic Modeling," David R. Coelho, IEEE Design & Test of Computers, vol. 7, Issue 3, Jun. 1990, pp. 25-32.

"Corrected Settling Time of the Distributed Parallel Arbiter," M.M. Taub, PhD., IEEE Proceedings, Part E: Computers & Digitals, vol. 139, Issue 4, Jul. 1992, pp. 348-354.

Jerry Banks, ed.; Handbook of Simulation; 1998; John Wiley & Sons, Inc.; pp. 3-51.

Robert W. Sebesta, Concepts of Programming Language, 1999 Addison Wesley L9ongman, Inc., Fourth Edition, pp. 105-131.

Lee, K.C., "A Virtual Bus Architecture for Dynamic Parallel Processing Parallel and Distributed Systems," IEEE Transactions on, vol. 4, Issue 2, Feb. 1993, pp. 121-130.

Lee, K.C., "A Virtual Bust for Dynamic Parallel Processing Parallel Distributed Processing," 1990, Proceedings of the Second IEEE Symposium on Dec. 9-13, 1990, pp. 736-743.

Damani, Om et al., "Fault-Tolerant Distributed Simulation," May 1998, Proceedings. Twelfth Workshop, May 26-29, 1998, pp. 38-45.

Tay, Seng Chuan, et al., "Speculative Parallel Simulation with an Adaptive Throttle Scheme," 1997, IEEE, pp. 116-122.

* cited by examiner

```
scf : SCF '{' scf_description '}'
    ;
scf_description : | model_instances routing
    ;
model_instances : one_instance more_instances
    ;
one_instance : BASENAME NAME ';'
    ;
more_instances : | more_instances one_instance
    ;
routing : | routing routing_exp
    ;
routing_exp : SCOPENAME1 '->' SCOPENAME1 ';'
    ;
```

*Fig. 10*

```
SCF {
    chip1 dsn1;
    chip2 dsn2;
    dcn dcn1;

dsn1.all_ports -> dsn2.all_ports;
    dsn2.all_ports -> dsn1.all_ports;
    dcn1.all_ports -> dsn1.all_ports;
}
```

*Fig. 11*

```
SCF {
    dsn1.all_ports -> dsn2.all_ports;
    dsn2.all_ports -> dsn1.all_ports;
}
```

*Fig. 12*

```
scf : SCF '{' scf_description '}'
    ;

scf_description : | model_instances routing
    ;

model_instances : one_instance more_instances
    ;

one_instance : BASENAME NAME ';'
             | HOTPULL BASENAME NAME ';'
             | HOTPLUG BASENAME NAME ';'
    ;

more_instances : | more_instances one_instance
    ;

routing : | routing routing_exp
    ;

routing_exp : SCOPENAME1 '->' SCOPENAME1 ';'
    ;
```

*Fig. 13*

```
SCF {
    hotpull chip1 dsn1;
    chip2 dsn2;
    dcn dcn1;

dsn1.all_ports -> dsn2.all_ports;
    dsn2.all_ports -> dsn1.all_ports;
    dcn1.all_ports -> dsn1.all_ports;
}
```

*Fig. 14*

HOT PLUG AND HOT PULL SYSTEM SIMULATION

BACKGROUND OF THE INVENTION

1. Field of the Invention

This invention is related to the field of simulation of electronic systems and, more particularly, to the simulation of hot plug and hot pull functionality of electronic systems.

2. Description of the Related Art

Generally, the development of components for an electronic system such as a computer system includes simulation of models of the components. In the simulation, the specified functions of each component may be tested and, when incorrect operation (a bug) is detected, the model of the component may be changed to generate correct operation. Once simulation testing is complete, the model may be fabricated to produce the corresponding component. Since many of the bugs may have been detected in simulation, the component may be more likely to operate as specified and the number of revisions to hardware may be reduced. The models are frequently described in a hardware description language (HDL) such as Verilog, VHDL, etc. The HDL model may be simulated in a simulator designed for the HDL, and may also be synthesized, in some cases, to produce a netlist and ultimately a mask set for fabricating an integrated circuit.

Many modern electronic systems are designed to allow for hot plug and/or hot pull of components. A component is "hot plugged" if the component is inserted into an electronic system without removing the power from the system. Similarly, a component is "hot pulled" from a system if the component is removed from the system without removing power from the system. Depending on the design of the system, the system may be brought to a quiesced state prior to the hot plug/hot pull operation or may be operating normally when the hot plug/hot pull occurs. Since the hot plug/hot pull functionality is part of the design of the system, it is desirable to simulate the hot plug/hot pull functionality.

SUMMARY OF THE INVENTION

In one embodiment, a distributed simulation system may include a first node configured to participate in a simulation and a second node configured to transmit a hot pull command designating the first node. The first node ceases participation in the simulation responsive to the hot pull command. In another embodiment, a distributed simulation system may include a first node configured to participate in a simulation and a second node configured to transmit a hot plug command designating the first node. The first node does not participate in the simulation prior to the hot plug command. Additionally, the first node begins participation in the simulation responsive to the hot plug command.

BRIEF DESCRIPTION OF THE DRAWINGS

The following detailed description makes reference to the accompanying drawings, which are now briefly described.

FIG. 10 is a Backus-Naur Form (BNF) description of one embodiment of a system configuration command (SCF command).

FIG. 11 is an example of one embodiment of an SCF command.

FIG. 12 is an example of one embodiment of a supplemental SCF command.

FIG. 13 is a BNF description of another embodiment of an SCF command.

FIG. 14 is an example of another embodiment of an SCF command.

Figure 1:
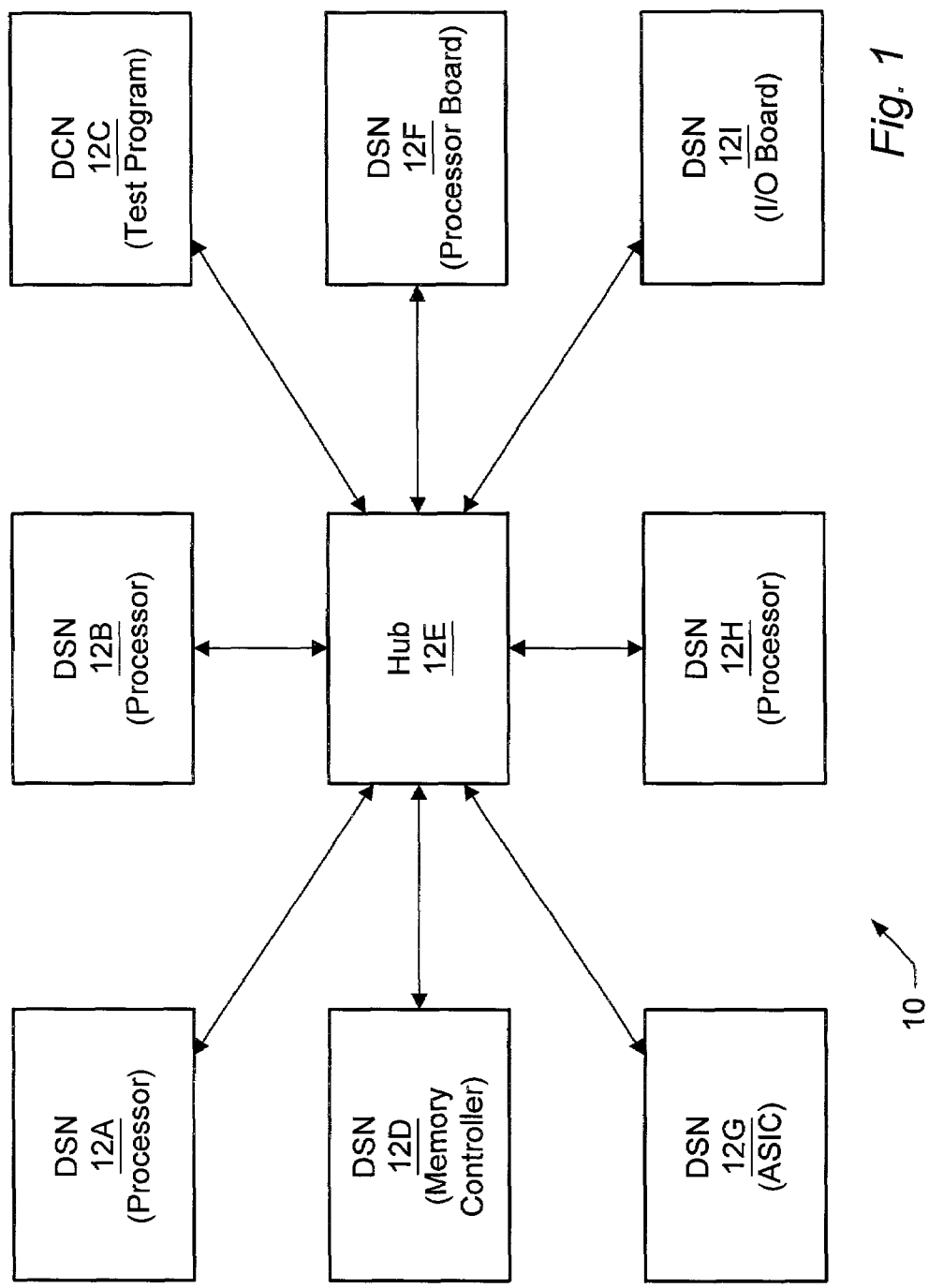
FIG. 1 is a block diagram of one embodiment of a distributed simulation system.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF EMBODIMENTS

Distributed Simulation System Overview

In the discussion below, both the computer systems comprising the distributed simulation system (that is, the computer systems on which the simulation is being executed) and the electronic system being simulated are referred to. Generally, the electronic system being simulated will be referred to as the "system under test".

Turning now to FIG. 1, a block diagram of one embodiment of a distributed simulation system 10 is shown. Other embodiments are possible and contemplated. In the embodiment of FIG. 1, the system 10 includes a plurality of nodes 12A-12I. Each node 12A-12D and 12F-12I is coupled to communicate with at least node 12E (which is the hub of the distributed simulation system). Nodes 12A-12B, 12D, and 12F-12I are distributed simulation nodes (DSNs), while node 12C is a distributed control node (DCN).

Generally, a node is the hardware and software resources for: (i) simulating a component of the system under test; or (ii) running a test program or other code (e.g. the hub) for controlling or monitoring the simulation. A node may include one or more of: a computer system (e.g. a server or a desktop computer system), one or more processors within a computer system (and some amount of system memory allocated to the one or more processors) where other processors within the computer system may be used as another node or for some other purpose, etc. The interconnection between the nodes illustrated in FIG. 1 may therefore be a logical interconnection. For example, in one implementation, Unix sockets are created between the nodes for communication. Other embodiments may use other logical interconnection (e.g. remote procedure calls, defined application programming interfaces (APIs), shared memory, pipes, etc.). The physical interconnection between the nodes may vary. For example, the computer systems including the nodes may be networked using any network topology. Nodes operating on the same computer system may physically be interconnected according to the design of that computer system.

A DSN is a node which is simulating a component of the system under test. A component may be any portion of the system under test. For example, the embodiment illustrated in FIG. 1 may be simulating a computer system, and thus the DSNs may be simulating processors (e.g. nodes 12A-12B and 12H), a processor board on which one or more of the processors may physically be mounted in the system under test (e.g. node 12F), an input/output (I/O) board comprising input/output devices (e.g. node 12I), an application specific integrated circuit (ASIC) which may be mounted on a processor board, a main board of the system under test, the I/O board, etc. (e.g. node 12G), a memory controller which may also be mounted on a processor board, a main board of the system under test, the I/O board, etc. (e.g. node 12D).

Depending on the configuration of the system under test, various DSNs may communicate. For example, if the processor being simulated on DSN 12A is mounted on the processor board being simulated on DSN 12F in the system under test, then input/output signals of the processor may be connected to output/input signals of the board. If the processor drives a signal on the board, then a communication between DSN 12A and DSN 12F may be used to provide the signal value being driven (and optionally a strength of the signal, in some embodiments). Additionally, if the processor being simulated on DSN 12A communicates with the memory controller being simulated on DSN 12D, then DSNs 12A and 12D may communicate signal values/strengths.

A DCN is a node which is executing a test program or other code which is not part of the system under test, but instead is used to control the simulation, introduce some test value or values into the system under test (e.g. injecting an error on a signal), monitor the simulation for certain expected results or to log the simulation results, etc.

A DCN may communicate with a DSN to provide a test value, to request a value of a physical signal or other hardware modeled in the component simulated in the DSN, to communicate commands to the simulator in the DSN to control the simulation, etc.

The hub (e.g. node 12E in FIG. 1) is provided for routing communications between the various other nodes in the distributed simulation system. Each DSN or DCN transmits message packets to the hub, which parses the message packets and forwards message packets to the destination node or nodes for the message. Additionally, the hub may be the destination for some message packets (e.g. for synchronizing the simulation across the multiple DSNs and DCNs).

As mentioned above, the communication between the nodes 12A-12I may be in the form of message packets. The format and interpretation of the message packets is specified by a grammar implemented by the nodes 12A-12I. The grammar is a language comprising predefined commands for communicating between nodes, providing for command/control message packets for the simulation as well as message packets transmitting signal values (and optionally signal strength information). Message packets transmitting signal values are referred to as signal transmission message packets, and the command in the message packet is referred to as a transmit command. The grammar may allow for more abstract communication between the nodes, allowing for the communication to be more human-readable than the communication of only physical signals and values of those signals between the nodes. As used herein, a physical signal is a signal defined in the simulation model of a given component of the system under test (e.g. an HDL model or some other type of model used to represent the given component). A logical signal is a signal defined using the grammar. Logical signals are mapped to physical signals using one or more grammar commands.

The grammar may include one or more commands for defining the configuration of the system under test. In one embodiment, these commands include a port of view (POV) command, a device description file (DDF) command, and a system configuration file (SCF) command. These commands may, in one implementation, be stored as files rather than message packets transmitted between nodes in the distributed simulation system. However, these commands are part of the grammar and may be transmitted as message packets if desired.

The POV command defines the logical port types for the system under test. Generally, signal information (which includes at least a signal value, and may optionally include a strength for the signal) is transmitted through a logical port in a message packet. That is, a message packet which is transmitting signal information transmits the signal information for one or more logical ports of a port type defined in the POV command. Accordingly, the POV command specifies the format of the signal transmission message packets. Generally, a logical port is an abstract representation of one or more physical signals. For example, the set of signals which comprises a particular interface (e.g. a predefined bus interface, a test interface, etc.) may be grouped together into a logical port. Transmitting a set of values grouped as a logical port may more easily indicate to a user that a communication is occurring on the particular interface than if the physical signals are transmitted with values.

In one embodiment, the logical ports may be hierarchical in nature. In other words, a given logical port may contain other logical ports. Accordingly, multiple levels of abstraction may be defined, as desired. For example, a bus interface which is pipelined, such that signals are used at different phases in a transaction on the bus interface (e.g. arbitration phase, address phase, response phase, etc.) may be grouped into logical ports for each phase, and the logical ports for the phases may be grouped into a higher level logical port for the bus as a whole. Specifically, in one embodiment, a logical port comprises at least one logical port or logical signal, and may comprise zero or more logical ports and zero or more logical signals in general. Both the logical ports and the logical signals are defined in the POV command. It is noted that the term "port" may be used below instead of "logical port". The term "port" is intended to mean logical port in such contexts.

The DDF command is used to map logical signals (defined in the POV command) to the physical signals which appear in the models of the components of the system under test. In one embodiment, there may be at least one DDF command for each component in the system under test.

The SCF command is used to instantiate the components of the system under test and to connect logical ports of the components of the system under test. The SCF command may be used by the hub for routing signal transmission message packets from one node to another.

In addition to the above mentioned commands, the grammar may include a variety of other commands. For example, commands to control the start, stop, and progress of the simulation may be included in the grammar.

While the embodiment shown in FIG. 1 includes a node operating as a hub (node 12E), other embodiments may not employ a hub. For example, DSNs and DCNs may each be coupled to the others to directly send commands to each other. Alternatively, a daisy chain or ring connection between nodes may be used (where a command from one node to another may pass through the nodes coupled therebetween). In some embodiments including a hub, the hub may comprise multiple nodes. Each hub node may be coupled to one or more DSN/DCNs and one or more other hub nodes (e.g. in a star configuration among the hub nodes). In some embodiments, a DCN or DSN may comprise multiple nodes.

While the present embodiment describes the used of logical signals defined in the POV and DDF commands, other embodiments may employ physical signals in the communications between nodes, as desired.

Hot Plug/Hot Pull Simulation

The distributed simulation system 10 may support hot plug/hot pull simulation for the system under test. A first DSN node may simulate the hot-plugged or hot-pulled component, and another DSN node or nodes may simulate the component or components which connect to the hot-plugged or hot-pulled component. The grammar may include hot plug and hot pull commands, which may be generated during a simulation to cause the hot plug or hot pull of the component. Since the first DSN node is a separate node from nodes simulating the other components of the system, the hot plug or hot pull functionality may be tested by controlling the participation of the first DSN node in the simulation before and after the hot plug/hot pull is to be performed.

In response to a hot pull command, the first node may cease participation in the simulation. Prior to the hot pull command, the first node may participate in the simulation. As used herein, a node may "participate in the simulation" if the component of the system under test assigned to that node is an active part of the simulation. The node may be actively simulating the model, sampling signals from the model of the component for transmission to other nodes and driving signal values received from other nodes to the model. Furthermore, the node may be responding to other commands transmitted to the node in a manner consistent with the command. A node may "not participate in the simulation" if the component is not an active part of the simulation. The node may not actively simulate the model (not sampling or driving signals, and responding to commands with a no-operation command or providing no response), or may be simulating the model and the hub may not be forwarding communications from the node to other nodes. In the above embodiments, the node is statically assigned simulation resources at the beginning of the simulation and the non-participation in the simulation is controlled via controlling operation of the node. Other embodiments are contemplated in which the node is dynamically removed from the distributed simulation system in response to the hot pull command. That is, the node may not be participating in the simulation by freeing any simulation resources assigned to the node. For example, a node may terminate execution in response to a hot pull command and may free any simulation resources assigned to the node. As used herein, the term "simulation resources" refers to any resource used by a node during simulation. Simulation resources may include one or more of: a computer system or portion thereof (e.g. processors, memory, disk storage, etc.) on which the node executes; a license for the software executing on the node (e.g. a simulator program); a socket or other communication resource for communicating with other nodes; etc. The simulation resources may then be free for assignment to other simulations, other nodes (e.g. nodes activated in response to a hot plug command, etc.).

In response to a hot plug command, the first node may begin participating in the simulation. Prior to the hot plug command, the first node may not participate in the simulation. A node may begin simulation by becoming an active part of the simulation. The node may become an active part of the simulation by actively simulating the component. Alternatively, the hub may begin to forward communications from the node to other nodes in response to the hot plug command (and may inhibit such forwarding prior to the hot plug command). The above embodiments may be used if the node is statically assigned simulation resources as the beginning of the simulation. Other embodiments may dynamically assign the simulation resources to the node in response to the hot plug command.

Figure 2:
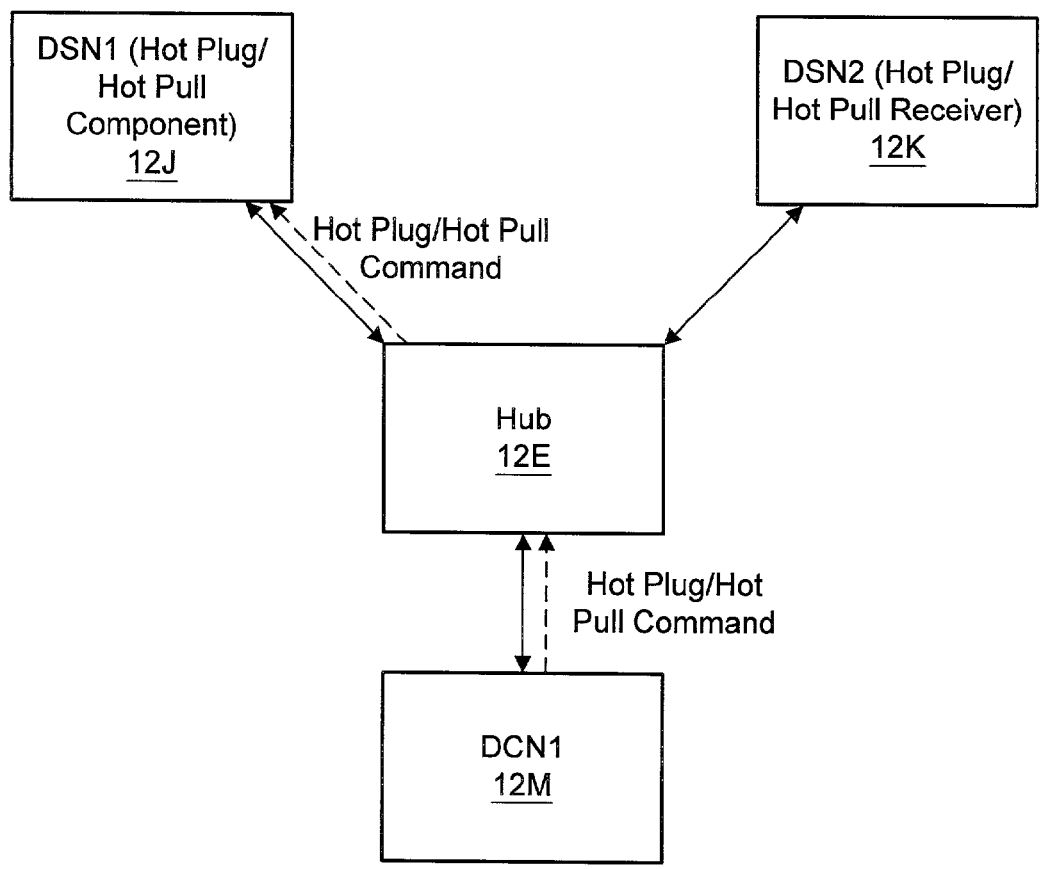
FIG. 2 is a block diagram of one embodiment of a portion of a distributed simulation system including a node simulating a hot plug or hot pull component and another node simulating a hot plug/hot pull receiver component.

Turning next to FIG. 2, a block diagram of a portion of a distributed simulation system for simulating the hot plug or hot pull of a component of the system under test is shown. Other embodiments are possible and contemplated. In the embodiment of FIG. 2, a DSN1 12J is shown which simulates the component to be hot plugged or hot pulled, a DSN2 node 12K is shown which simulates a component which connects to the hot-plugged/hot-pulled component, the hub 12E is shown, and a DCN1 node 12M is shown. Each of the DSN1 12J, the DSN2 12K, and the DCN1 12M are coupled to the hub 12E. In other embodiments, as mentioned above, the distributed simulation system may not include a hub and thus the DSN1 12J, the DSN2 12K, and the DCN1 12M may communicate directly or indirectly in various fashions.

The DCN1 12M may transmit a hot plug or hot pull command to cause the hot plug or hot pull of the component simulated by the DSN1 12J (illustrated as a dotted line from the DCN1 12M to the hub 12E in FIG. 2). Generally, the hot plug or hot pull command may include at least one operand: the name of the DSN to be hot plugged or hot pulled, respectively (e.g. DSN1 12J in the example of FIG. 2). The hot plug or hot pull command may be transmitted during the simulation time in which the hot plug or hot pull is to occur. For example, in an event driven simulation, the hot plug or hot pull command may be transmitted in the simulation time step in which the hot plug or hot pull is desired. In a cycle based simulation, the hot plug or hot pull command may be transmitted in the clock cycle in which the hot plug or hot pull is desired. Alternatively, the hot plug or hot pull command may include a time reference (e.g. time step or clock cycle) indicating the time at which the hot plug or hot pull is to occur. The hot plug or hot pull command may be transmitted prior to the time indicated by the time reference, and the receiving node (hub or DSN, depending on which implements the hot plug/hot pull functionality) may cause the hot plug or hot pull at the designated time. In some embodiments, the hot plug or hot pull command may also include the name of the source node (e.g. the DCN1 12M in this example) as an operand.

In some embodiments, the hub 12E may forward the hot plug/hot pull command to the DSN1 12J (the DSN identified in the operands of the hot plug/hot pull command). If the hot plug/hot pull functionality is implemented in the hub (e.g. by forwarding or not forwarding communications from the DSN1 12J), the hub may not forward the hot plug/hot pull command to the DSN1 12J. Alternatively, the hot plug/hot pull functionality may be shared between the hub and the DSN. In shared cases, the hot plug/hot pull command may also be forwarded to the DSN1 12J.

Figure 5:
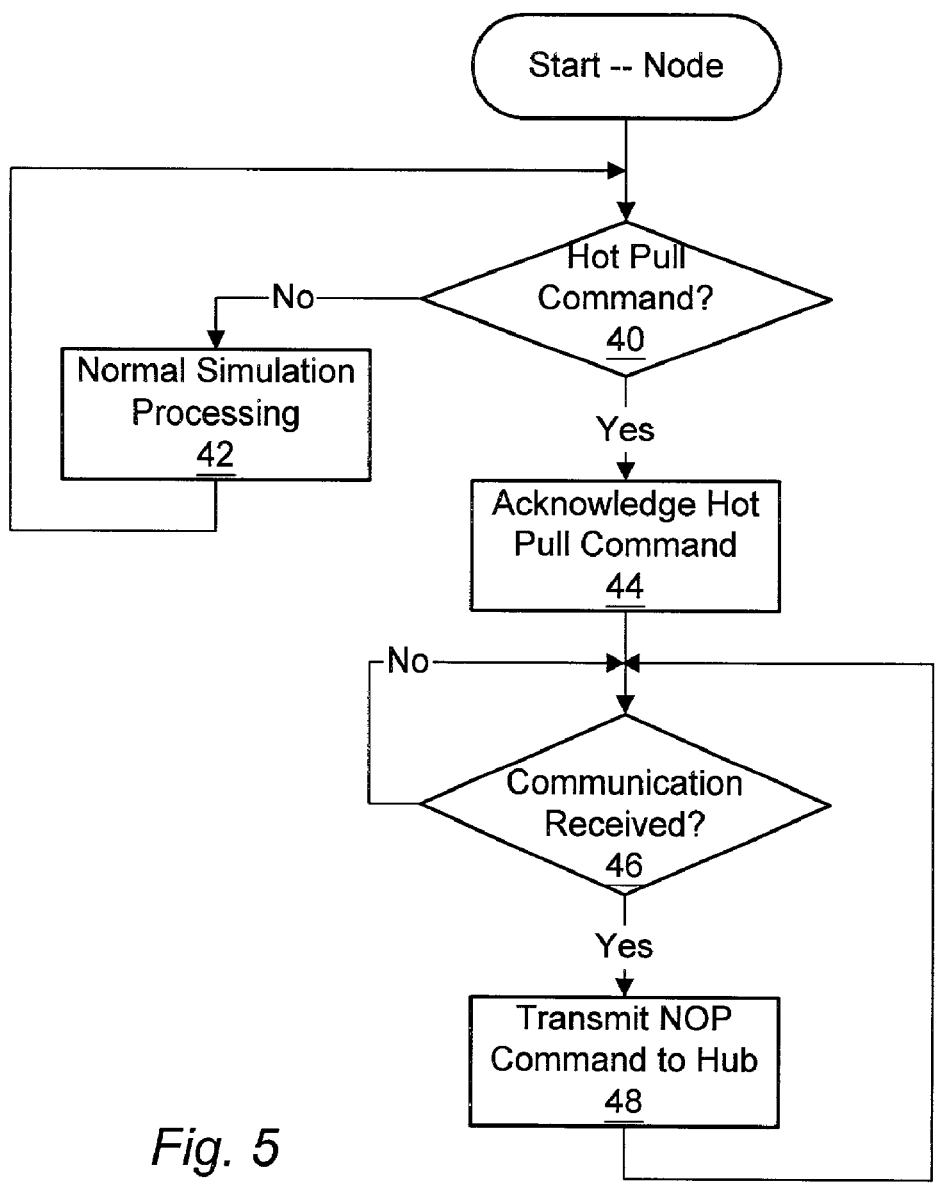
FIG. 5 is a flowchart illustrating operation of one embodiment of a node for processing a hot pull command.
Figure 6:
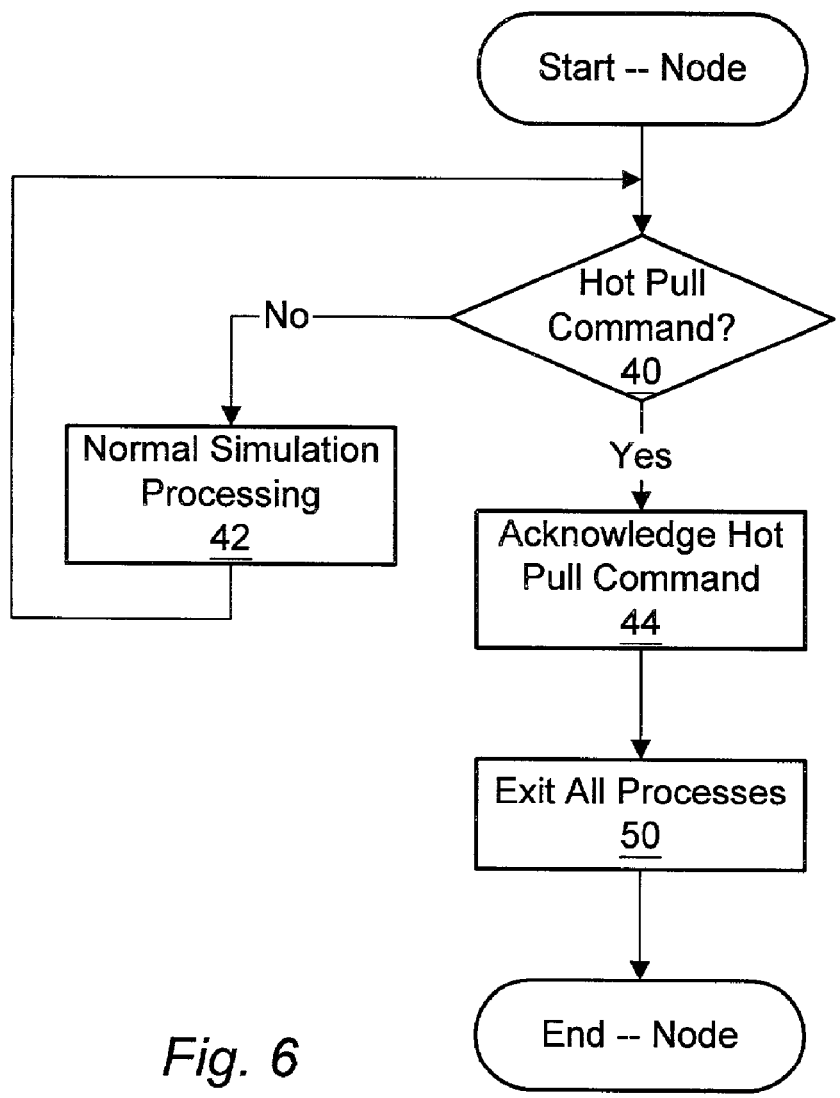
FIG. 6 is a flowchart illustrating operation of another embodiment of a node for processing a hot pull command.
Figure 7:
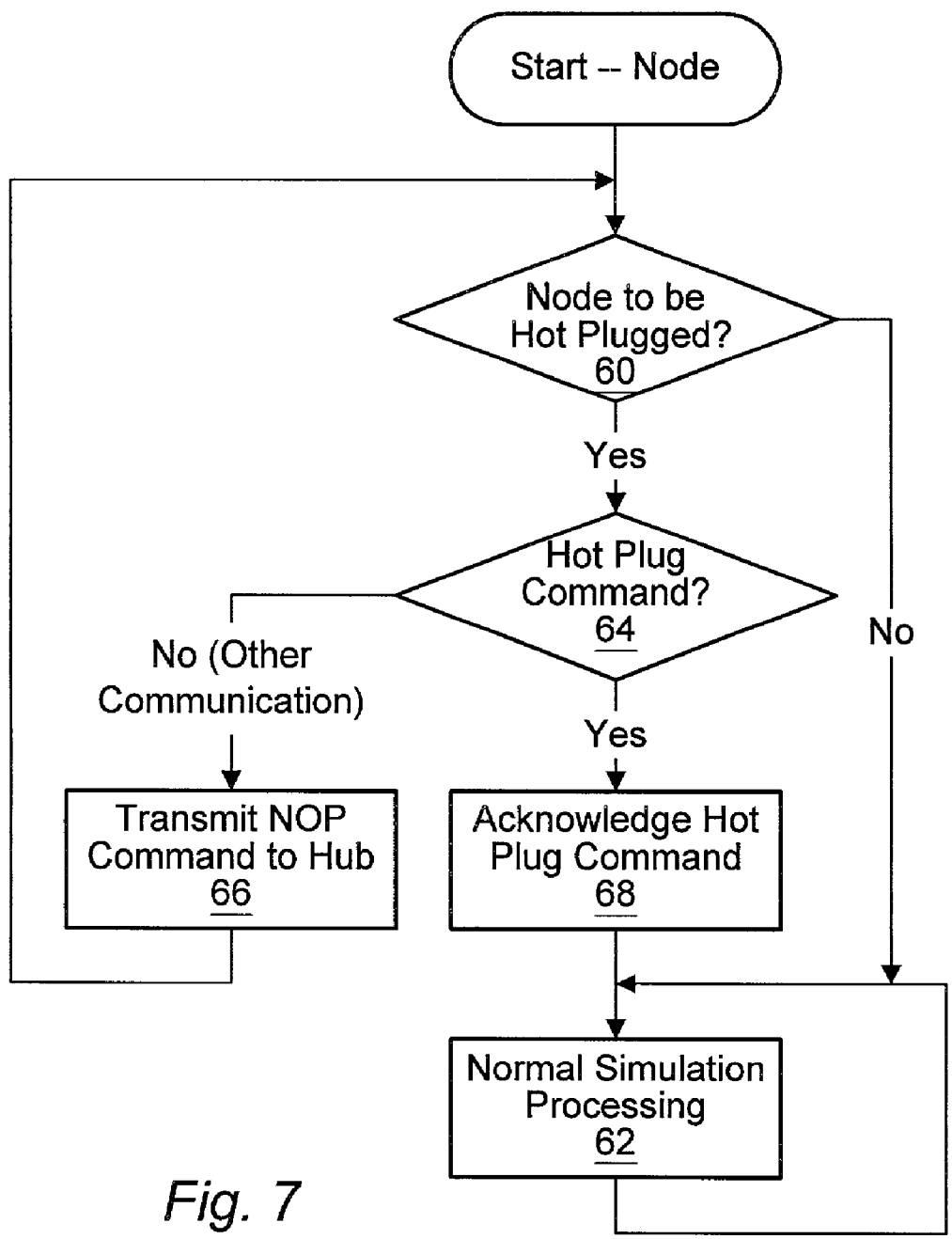
FIG. 7 is a flowchart illustrating operation of one embodiment of a node for processing a hot plug command.
Figure 8:
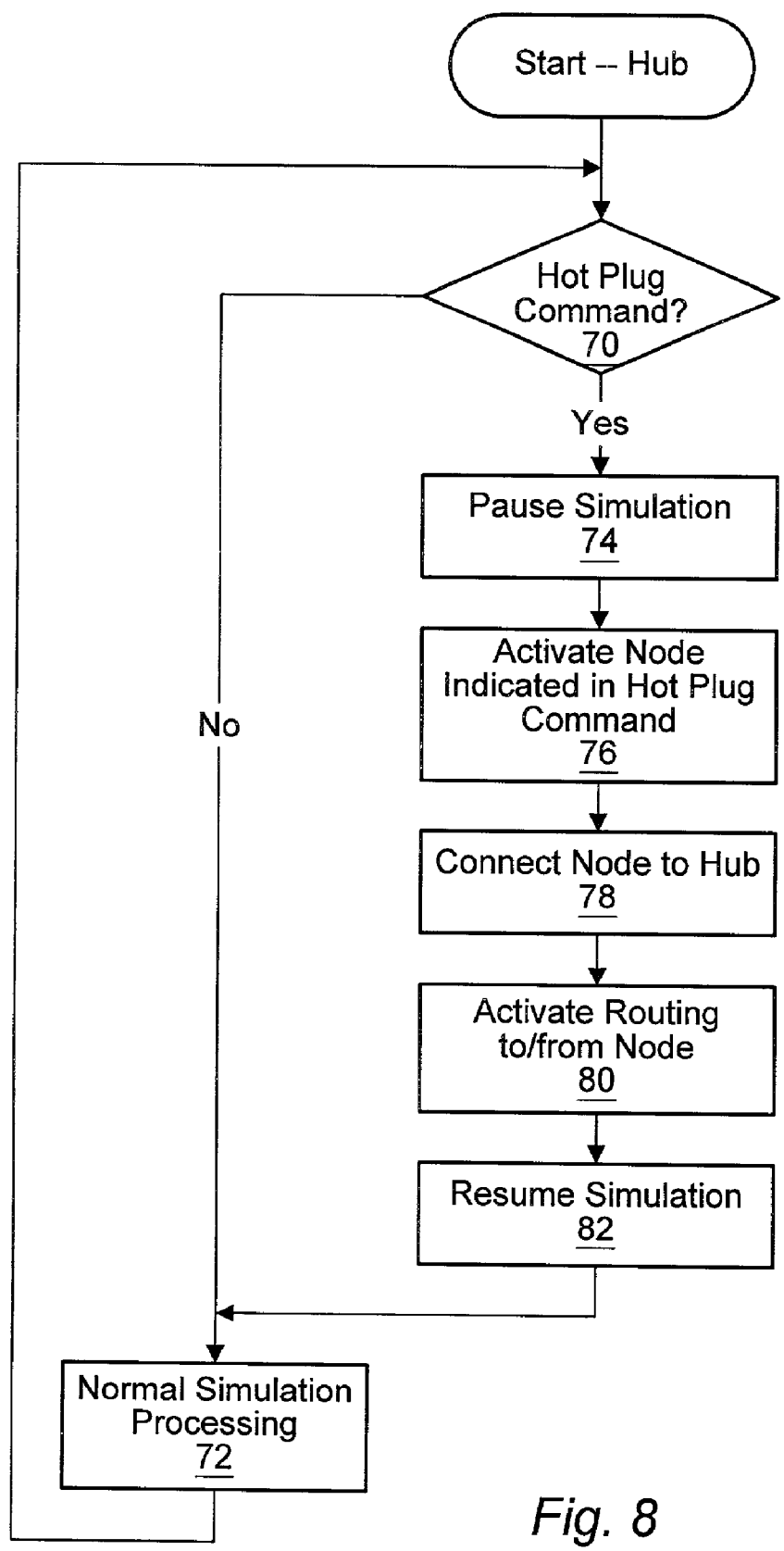
FIG. 8 is a flowchart illustrating operation of one embodiment of a hub for processing a hot plug command.
Figure 9:
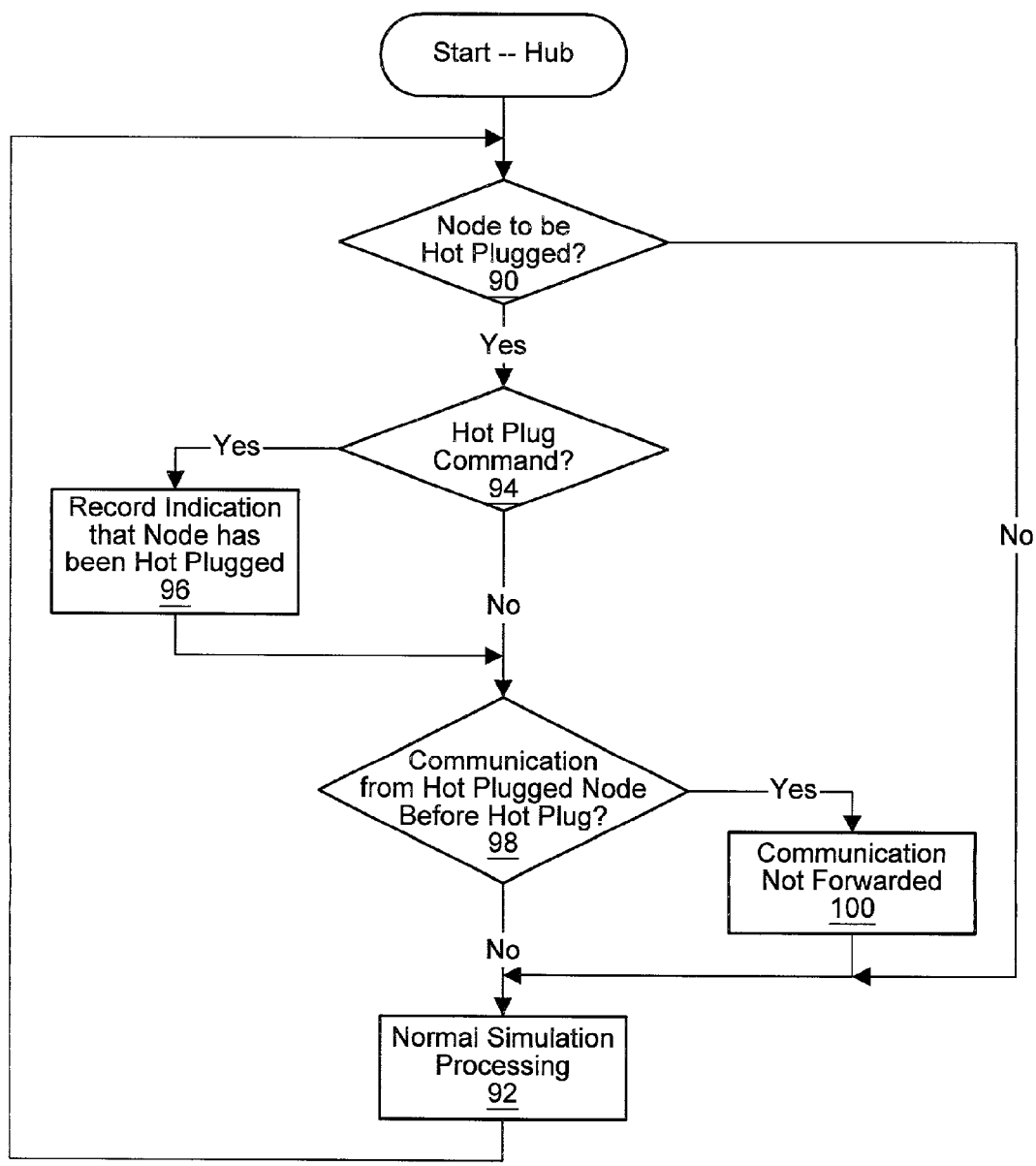
FIG. 9 is a flowchart illustrating operation of another embodiment of the hub for processing a hot plug command.

Turning next to FIGS. 3-9, flowcharts are shown illustrating various exemplary embodiments of instruction code implemented in the hub or in the DSN for performing hot plug and hot pull simulation. FIGS. 3-6 illustrate exemplary embodiments for hot pull operation, and FIGS. 7-9 illustrate exemplary embodiments for hot plug simulation. Each flowchart illustrates blocks in a particular order for ease of understanding, although other orders may be used as desired. Generally, each flowchart may represent a sequence of instructions which, when executed on a computer system or portion thereof assigned to the DSN or hub, causes the specified functionality to occur. Blocks which detect a hot plug/hot pull command may represent current receipt of the hot plug/hot pull command (if no time reference is supplied) or previous receipt of the hot plug/hot pull command with a time reference that is currently expiring. It is noted that the same node may be both hot plugged and hot pulled in a simulation (or may even be hot plugged and/or hot pulled multiple times in a simulation). The flowcharts illustrate operation in response to one command, and the operation may be repeated in response to multiple hot plug/hot pull commands.

Figure 3:
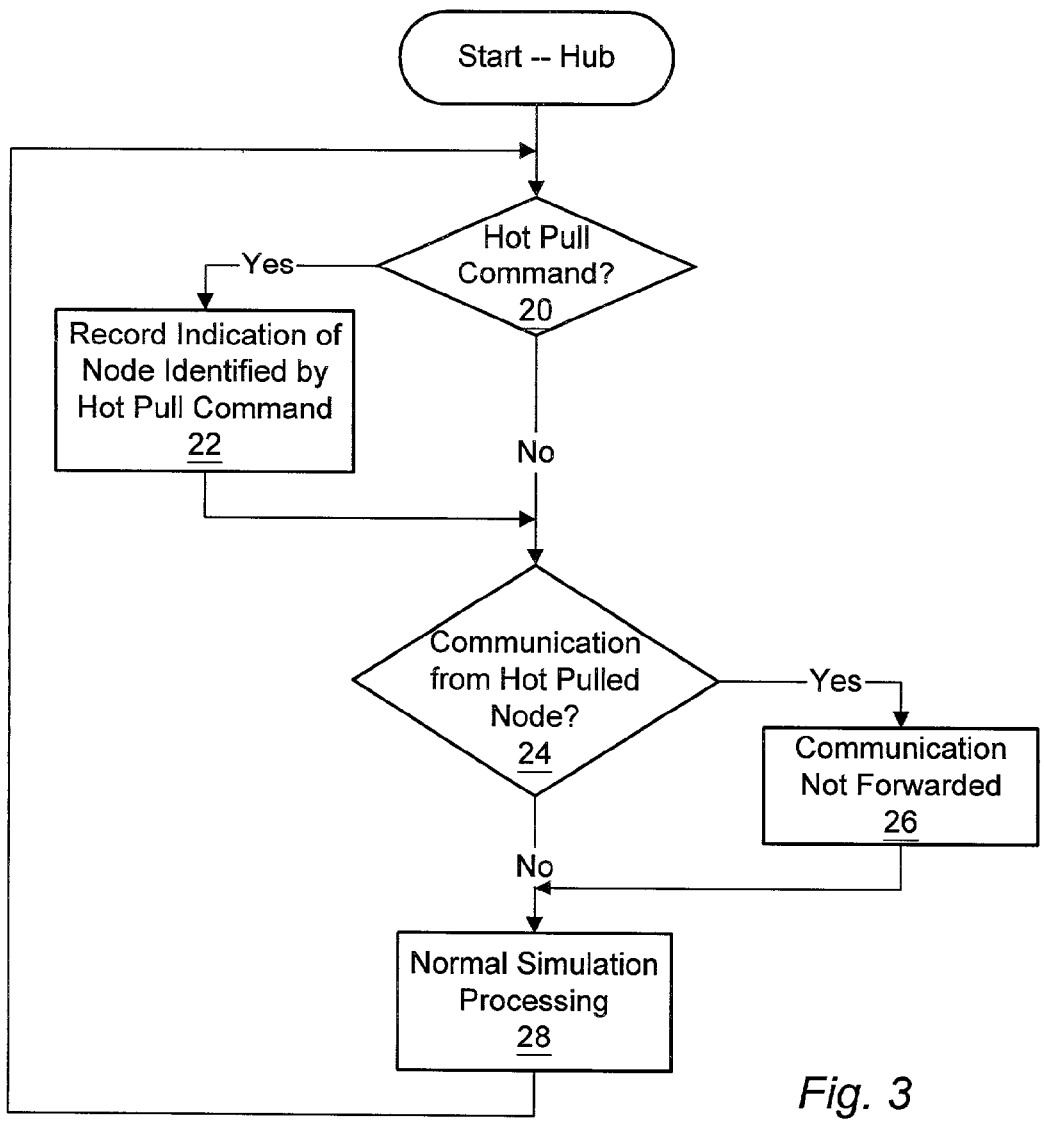
FIG. 3 is a flowchart illustrating operation of one embodiment of a hub for processing a hot pull command.

FIG. 3 is a flowchart illustrating operation of one embodiment of the hub 12E for processing a hot pull command. Other embodiments are possible and contemplated. The embodiment of FIG. 3 may be used in embodiments of the distributed simulation system in which the hot-pulled node is statically part of the distributed simulation system and in which the hub handles the hot pull functionality.

If a hot pull command is detected by the hub (decision block 20), the hub may record an indication of the node which has been hot pulled (block 22). The hub may implement any data structure for recording which nodes have been hot pulled.

If a communication is received from a hot-pulled node (decision block 24), the communication is not forwarded to any receiving nodes (block 26). For example, in FIG. 2, if the DSN1 12J has been hot pulled, any communications from the DSN1 12J to the DSN2 12K (e.g. signal transmission message packets) are not forwarded by the hub 12E to the DSN2 12K. In this fashion, the DSN1 12J (or any hot-pulled DSN) need not be aware of the hot pull. The hot-pulled node may continue simulating, and the hub may ensure that no communication is forwarded (thus simulating that the component has been removed from the system under test). Optionally, the hub 12E may also detect communications to the hot-pulled node and may not forward those communications to the hot-pulled node.

The hub 12E may detect that the communication is from a hot-pulled node (decision block 24) by checking the data structure which records node(s) that have been hot pulled. The hub 12E may optionally log any communications received from a hot-pulled node, if desired, along with other communications received from other nodes. If a communication from a hot-pulled node is received, the hub 12E does not forward the communication to other nodes (block 26).

With the exception of not forwarding communications from the hot-pulled node to other nodes, the hub 12E may generally perform normal simulation processing (block 28). Generally, the normal simulation processing may include forwarding message packets from one node to another (e.g. signal transmission message packets may be routed according to the routings established in the SCF command), synchronizing the simulation among the distributed nodes, etc. The normal simulation processing may also involve checking for hot plug commands similar to embodiments described in more detail below.

Figure 4:
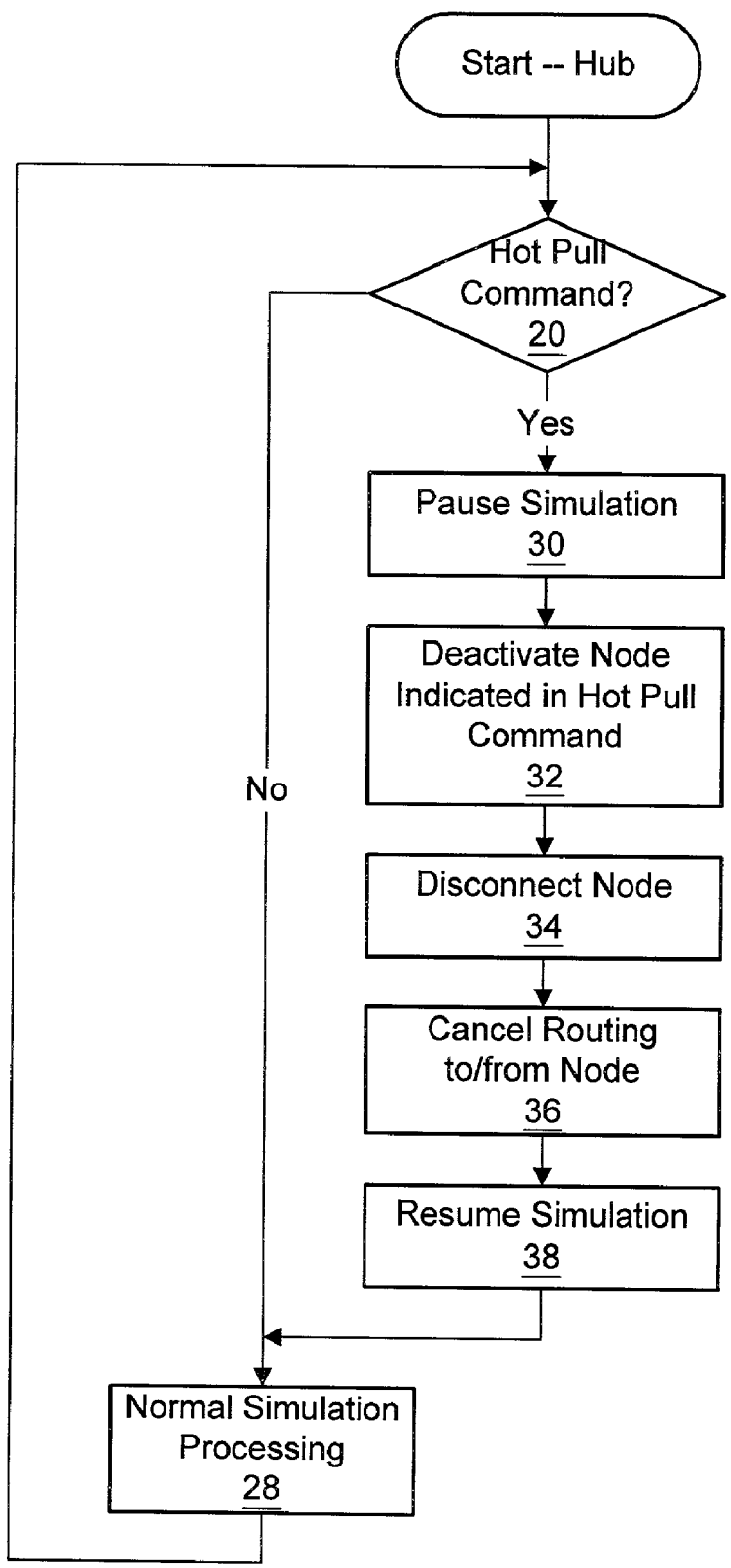
FIG. 4 is a flowchart illustrating operation of another embodiment of a hub for processing a hot pull command.

FIG. 4 is a flowchart illustrating operation of another embodiment of the hub 12E for processing a hot pull command. Other embodiments are possible and contemplated. The embodiment of FIG. 4 may be used in embodiments of the distributed simulation system in which the hot-pulled node is dynamically removed from the distributed simulation system in response to the hot pull command, and in which the hub handles the hot pull functionality.

If the hub 12E does not detect a hot pull command (decision block 20), the hub 12E continues with normal simulation processing (block 28), similar to the discussion above with respect to FIG. 3.

If a hot pull command is detected (decision block 20), the hub 12E may pause the simulation (block 30). In one embodiment, the grammar may include a pause command (or a stop command) which may be transmitted by the hub 12E to each distributed node. Each distributed node may acknowledge the pause command (e.g. by returning a no-operation, or NOP, command), and the simulation may be considered to be paused once each node has responded. The simulation may be paused to allow for several operations involved in dynamically hot pulling the node to be performed without simulation progressing in the other nodes. Other embodiments may not pause the simulation, as desired.

The hub 12E may deactivate the hot-pulled node (block 32). That is, the hub 12E may transmit a command to the node to cause the node to terminate execution. For example, a finish command may be included in the grammar for terminating simulation (of a particular node, or of the simulation as a whole by broadcasting the finish command to all nodes). The node may acknowledge the finish command and may terminate. The hub 12E may also disconnect the node (block 34) from communication with the hub. For example, in an embodiment in which sockets are used for communication, the socket may be closed.

The hub 12E may cancel routings to and from the node being hot pulled (block 36). The cancellation may be performed in a variety of manners. For example, the hub 12E may identify routings related to the node using the node name, and cancel the routings. Alternatively, the DCN which transmitted the hot pull command may also transmit a supplemental SCF command which specifies the routings to be cancelled, and the hub 12E may used the supplemental SCF command to cancel the routings. In yet another alternative, the SCF command supplied to the hub at the beginning of the simulation may identify certain nodes (e.g. with a keyword, as illustrated in FIGS. 13-14) which may be hot pulled. The hub 12E may cancel routings corresponding to the identified node(s) in response to the hot pull command(s).

The hub 12E may resume the simulation (block 38). The grammar may include a resume command (or a start command) which may be used to cause the paused simulation to resume. The resumed simulation may then continue with normal simulation processing.

By dynamically removing the hot-pulled node from the distributed simulation system in response to the hot pull command, the simulation resources formerly assigned to the hot-pulled node may be freed. The computer resources used to perform the simulation may be used to perform some other simulation, or some other work, as desired. The simulation program licenses may be used to run some other simulation.

It is noted that one or more of the blocks 30-38 may be performed by the DCN which transmitted the hot pull command, if desired. Alternatively, other code may be used to perform any of the blocks 30-38.

Turning next to FIG. 5, a flowchart is shown illustrating operation of one embodiment of a node (e.g. DSN1 12J) for processing a hot pull command. Other embodiments are possible and contemplated. The embodiment of FIG. 5 may be used in embodiments of the distributed simulation system in which the hot-pulled node is statically part of the distributed simulation system and in which the hot-pulled node handles the hot pull functionality. In such an embodiment, the hub 12E may forward the hot pull command to the node identified as the hot-pulled node in the hot pull command.

If a hot pull command is not detected (decision block 40), the node may perform normal simulation processing (block 42). Generally, normal simulation processing in the node may include sampling signals from the model of the component being simulated in the node for transmission to other nodes, driving signals received from other nodes to the model, communicating with the hub for simulation synchronization, responding to other commands received by the node, etc. The normal simulation processing may also involve checking for hot plug commands similar to embodiments described in more detail below.

If a hot pull command is detected (decision block 40), the node may acknowledge the hot pull command by transmitting a message to the hub (block 44). For example, the node may transmit a NOP command to indicate reception of the hot pull command. Any other acknowledgement command may be used.

Subsequent to receiving the hot pull command, the node may respond to any received communications with a NOP command (decision block 46 and block 48). The node may check the received communications for control commands (e.g. pausing the simulation, terminating the simulation, etc.), but otherwise may ignore the received communications. If commands other than the NOP command are used for simulation synchronization, the node may respond to synchronization commands appropriately and may respond to remaining commands with the NOP command. In particular, the node may not sample signals from the model being simulated in the node and may not drive signals to the model in response to receiving signal transmission message packets. The node may be configured to transmit default values on the output signals of the model, in some embodiments. The node may be configured, in some embodiments, to terminate the simulation program operating in the node in response to the hot pull command, while still remaining active to respond with NOP commands or other commands to any command received by the node.

After being hot pulled, the node may support being hot plugged. The node may check for a hot plug command in the commands received, and may acknowledge the hot plug command and return to normal simulation (blocks 40 and 42).

FIG. 6 is a flowchart illustrating operation of another embodiment of a node for processing a hot pull command. Other embodiments are possible and contemplated. The embodiment of FIG. 6 may be used in embodiments of the distributed simulation system in which the hot-pulled node is dynamically removed from the distributed simulation system in response to the hot pull command, and in which the hot-pulled node handles the hot pull functionality. In such an embodiment, the hub 12E may forward the hot pull command to the node identified as the hot-pulled node in the hot pull command.

If the node does not detect a hot pull command (decision block 40), the node may perform normal simulation processing (block 42), similar to the discussion above with respect to FIG. 5. If the node detects the hot pull command, (decision block 40), the node may acknowledge the hot pull command (block 44), again similar to the discussion above. However, in this embodiment, the node may exit all processes corresponding to that node (block 50), thus freeing simulation resources assigned to the node. The exiting of processes may also include disconnecting from the hub 12E (e.g. closing the socket, for embodiments using socketed communication), releasing software licenses held by the node, etc. For the embodiment of FIG. 6, the hub may also be configured to cancel routings to the node (e.g. automatically, in response to keywords in the original SCF command, or in response to a supplemental SCF command).

Turning now to FIG. 7, a flowchart is shown illustrating operation of one embodiment of a node (e.g. DSN1 12J) for processing a hot plug command. Other embodiments are possible and contemplated. The embodiment of FIG. 7 may be used in embodiments of the distributed simulation system in which the hot-plugged node is statically part of the distributed simulation system and in which the hot-plugged node handles the hot plug functionality. In such an embodiment, the hub 12E may forward the hot plug command to the node identified as the hot-plugged node in the hot plug command.

The node may be provided an indication of whether or not it is to be hot plugged during the simulation. The indication may be provided in a command file provided to the node, may be in the first command transmitted to the node when the simulation is started, etc. If the node is not to be hot-plugged (decision block 60), the node may perform normal simulation processing (block 62). Generally, normal simulation processing in the node may include sampling signals from the model of the component being simulated in the node for transmission to other nodes, driving signals received from other nodes to the model, communicating with the hub for simulation synchronization, responding to other commands received by the node, etc. The normal simulation processing may also involve checking for hot pull commands similar to embodiments described above.

If the node is to be hot plugged (decision block 60), the node attempts to detect the hot plug command (decision block 64). If the hot plug command is not detected, the node may respond to the communication with a NOP command (block 66). On the other hand, if the hot plug command is detected, the node may acknowledge the hot plug command (e.g. with a NOP command or other acknowledgement command) (block 68). The node may then continue with normal simulation processing (block 62).

After being hot plugged, the node may support being hot pulled. The node may check for a hot pull command in the commands received, and may acknowledge the hot pull command and return to waiting for a hot plug command (blocks 60, 64, and 66).

FIG. 8 is a flowchart illustrating operation of one embodiment of the hub 12E for processing a hot plug command. Other embodiments are possible and contemplated. The embodiment of FIG. 8 may be used in embodiments of the distributed simulation system in which the hot-plugged node is dynamically added to the distributed simulation system and in which the hub 12E handles the hot plug functionality.

The hub 12E detects the hot plug command (decision block 70). If the hot plug command is not detected, the hub 12E may continue with normal simulation processing (block 72). Generally, the normal simulation processing may include forwarding message packets from one node to another (e.g. signal transmission message packets may be routed according to the routings established in the SCF command), synchronizing the simulation among the distributed nodes, etc.

The normal simulation processing may also involve checking for hot pull commands similar to embodiments described above.

If a hot plug command is detected (decision block 70), the hub 12E may pause the simulation (block 74). In one embodiment, the grammar may include a pause command (or a stop command) which may be transmitted by the hub 12E to each distributed node. Each distributed node may acknowledge the pause command (e.g. by returning NOP command), and the simulation may be considered to be paused once each node has responded. The simulation may be paused to allow for several operations involved in dynamically hot plugging the node to be performed without simulation progressing in the other nodes. Other embodiments may not pause the simulation, as desired.

The hub 12E may activate the hot-plugged node (block 76). That is, the hub 12E may allocate simulation resources for the node (including computer hardware for executing the simulation, obtaining any software licenses for software to execute during the simulation of the hot-plugged node, etc.). The hub 12E may also connect the node (block 78) for communication with the hub. For example, in an embodiment in which sockets are used for communication, the socket may be opened.

The hub 12E may activate routings to and from the node being hot plugged (block 80). The activation may be performed in a variety of manners. For example, the DCN which transmitted the hot plug command may also transmit a supplemental SCF command which specifies the routings to be added, and the hub 12E may used the supplemental SCF command to add the routings. Alternatively, the SCF command supplied to the hub at the beginning of the simulation may identify certain nodes (e.g. with a keyword, as illustrated in FIGS. 13-14) which may be hot plugged. The hub 12E may add the routings corresponding to the identified node(s) in response to the hot plug command(s).

The hub 12E may resume the simulation (block 82). The grammar may include a resume command (or a start command) which may be used to cause the paused simulation to resume. The resumed simulation may then continue with normal simulation processing.

It is noted that one or more of blocks 74-82 may be performed by the DCN which transmits the hot plug command, or by other code, as desired. For example, the blocks 78-80 may be performed in the dynamically-added node, if desired.

Turning now to FIG. 9, a flowchart is shown illustrating operation of another embodiment of the hub 12E for processing a hot plug command. Other embodiments are possible and contemplated. The embodiment of FIG. 9 may be used in embodiments of the distributed simulation system in which the hot-plugged node is statically part of the distributed simulation system and in which the hub 12E handles the hot plug functionality.

The hub 12E may be provided an indication of whether or not a node is to be hot plugged during the simulation. The indication may be provided in a command file provided to the hub, may be in the first command transmitted to the hub when the simulation is started, may be a keyword in the SCF command (e.g. FIGS. 13-14), etc. If a node is not to be hot-plugged (decision block 90), the node may perform normal simulation processing (block 92). Generally, the normal simulation processing may include forwarding message packets from one node to another (e.g. signal transmission message packets may be routed according to the routings established in the SCF command), synchronizing the simulation among the distributed nodes, etc. The normal simulation processing may also involve checking for hot pull commands similar to embodiments described above.

If a node is to be hot-plugged (decision block 90), the hub checks for a hot plug command (decision block 94). If the hub detects a hot plug command, the hub may record an indication that the node has been hot plugged (block 96). The indication may be recorded in any data structure.

If the hub 12E detects a communication from a node indicated as being hot-plugged in the simulation, and the communication is prior to the node being hot plugged (decision block 98), the hub 12E does not forward the communication to the other nodes (block 100). Otherwise, the hub 12E may continue with normal simulation processing (block 92).

FIGS. 10-12 illustrate a first embodiment of an SCF command which may be used with embodiments in which hot-plugged and hot-pulled nodes are dynamically added or removed from the distributed simulation system. Other embodiments are possible and contemplated. Additionally, the embodiment shown in FIGS. 10-11 may be used in static embodiments, and no supplemental SCF command may be required. Alternatively, the supplemental SCF command may be used in the static case as well, to prevent routings of transmit commands to a hot-pulled node after the hot pull occurs or routings to a hotplugged node before the hot plug occurs.

FIG. 10 is a BNF description of the SCF command. In FIG. 10, the words shown in upper case are tokens for the lexer used in the generation of a parser for parsing the SCF command, while words shown in lower case are terms defined in other BNF expressions.

The SCF command includes an enumeration of the model instances within the system under test (each of which becomes a DSN or DCN in the distributed simulation system) and a set of routing expressions which define the connections between the logical ports of the model instances. The model instances are declared using a model type followed by a name for the model instance. A DDF command (not shown) is provided for the model type to define its physical signal to logical signal mapping. The model name is used in the transmit commands, as well as in the routing expressions within the SCF command. Each routing expression names a source port and a destination port. Transmit commands are routed from the source port to the destination port. The port name in these expressions is hierarchical, beginning with the model instance name and using a "." as the access operator for accessing the next level in the hierarchy. Thus, a minimum port specification in a routing expression is of the form model_name.port_name1. A routing expression for routing the port_name2 subport of port_name1 uses model_name.port_name1.port_name2. In this example, a routing expression of the form model_name.port_name1 may route any signals encompassed by port_name1 (including those within port_name2). On the other hand, a routing expression of the form model_name.port_name1.port_name2 routes only the signals encompassed by port_name2 (and not other signals encompassed byport_name1 but not port_name2). The routing operator is defined, in this embodiment, to be "->" where the source port is on the left side of the routing operator and the destination port is on the right side of the routing operator.

In the SCF command, bi-directional ports may be created using two routing expressions. Alternatively, one routing expression may create a bi-directional port routing. The first routing expression routes the first port (as a source port) to the second port (as a destination port) and the second routing expression routes the second port (as a source port) to the first port (as a destination port). Additionally, a single port may be routed to two or more destination ports using multiple routine expressions with the single port as the source port and one of the desired destination ports as the destination port of the routing expression.

FIG. 11 is an exemplary SCF command for the portion of the distributed simulation system shown in FIG. 10. The first three lines instantiate the DSN1 node 12J, the DSN2 node 12K, and the DCN1 node 12M. The routing expressions establish a bi-directional routing between a top level port (named "all_ports") of DSN1 and DSN2 and a routing from DCN1 to DSN1 (e.g. to transmit the hot pull or hot plug command, if applicable). The routings are merely exemplary. There may be unidirectional routings in addition to bidirectional routings, in general. The example of FIG. 11 may be the SCF command used at the beginning of a simulation. If the DSN1 node 12J is hot-pulled, a supplemental SCF command (e.g. FIG. 12) may be supplied to cancel the routings between DSN1 and DSN2. Alternatively, if the DSN1 node 12J is to be hot-plugged, the initial SCF command may be similar to FIG. 11 without the first two routing expressions, and the supplemental SCF command of FIG. 12 may be used with the hot plug command to supply the routings to be added after the hot plug.

FIGS. 13-14 illustrate a second embodiment of an SCF command which may be used with embodiments in which hot-plugged and hot-pulled nodes are dynamically added or removed from the distributed simulation system. Other embodiments are possible and contemplated. Additionally, the embodiment shown in FIGS. 13-14 may be used in static embodiments, to prevent routings of transmit commands to a hot-pulled node after the hot pull occurs or routings to a hot-plugged node before the hot plug occurs.

The SCF command illustrated in FIGS. 13-14 is similar to the embodiment of FIGS. 10-12, except that an optional "hotplug" or "hotpull" keyword may prefix the model instances. The "hotplug" keyword may be used to indicate models which may be hot plugged during the simulation. The "hotpull" keyword may be used to indicate models which may be hot pulled during the simulation. To support multiple hot plug or hot pull commands in a simulation, the keywords may be augmented with an identification of the node which is affected by the hot plug or hot pull command, and the corresponding hot plug or hot pull command may activate or deactivate only the identified routings for the node being hot plugged or hot pulled. FIG. 14 illustrates an exemplary SCF command according to the BNF shown in FIG. 13 for a hot pull of the DSN1 node.

For the BNF descriptions in FIGS. 10 and 13, the tokens shown have the following definitions: NAME is a legal HDL signal name, including the bit index portion (e.g. [x:y] or [z], where x, y, and z are numbers, in a Verilog embodiment) if the signal includes more than one bit; BASENAME is the same as NAME but excludes the bit index portion; SCF is the "SCF" command name; SCOPENAME1 is a scoped name using BASENAMES (e.g. BASENAME.BASENAME.BASENAME); HOTPULL is the "hotpull" keyword; and HOTPLUG is the "hotplug" keyword.

While the logical ports are used in the exemplary SCF files, other embodiments may route physical signals.

While the hot plug/hot pull commands have been described above in terms of simulating a hot plug or hot pull of a component of the system under test. The hot plug/hot pull commands may have other uses in the distributed simulation system as well. For example, the hot plug and hot pull commands, when dynamic adding or deletion of the hot plugged or hot pulled nodes is used, may be used to conserve simulation resources during a simulation if a given node is known to be needed only for a portion of a simulation.

For example, if a set of two or more DCNs are to be used in a simulation, but each DCN is operative for only part of the simulation, each DCN may be hot plugged and hot pulled into and out of the simulation to occupy simulation resources assigned to that DCN node for the time in which the DCN is operative and not occupying the simulation resources during other times. While DCNs are hot plugged and hot pulled as needed in this example, other examples may hot plug/hot pull DSNs in a similar fashion.

Figure 15:
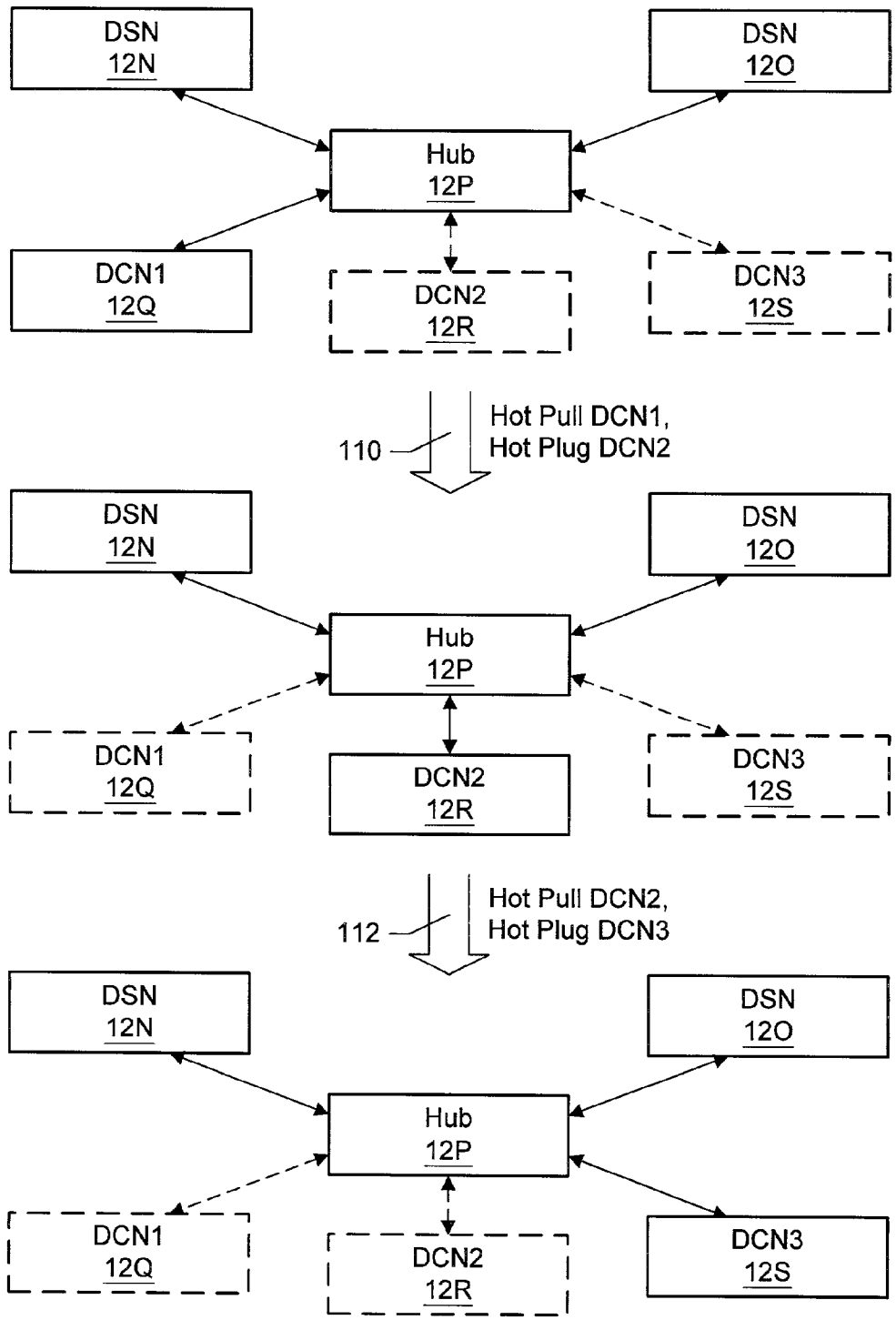
FIG. 15 is a block diagram illustrating an exemplary distributed simulation system and the use of hot plug and hot pull commands for resource conservation.

FIG. 15 is an example in which three DCNs are used. First, DCN1 is used, followed by DCN2 after DCN1 completes, followed by DCN3 after DCN2 completes. While FIG. 15 illustrates DCNs being added and deleted in series, DCNs may be added or deleted as needed, even if overlapping with the time that other DCNs are active. Furthermore, DSNs may be added or deleted for resource conservation purposes as well, in a similar fashion. FIG. 15 illustrates a distributed simulation system including two DSNs (nodes 12N and 12O), a hub 12P, and three DCNs (DCN1 12Q, DCN2 12R, and DCN3 12S). The three DCNs are added to the distributed simulation system as needed and are deleted from the distributed simulation system when completed. In FIG. 15, the nodes which are currently active in the system (assigned simulation resources and in operation) are shown with solid lines and nodes which are not active in the system (not assigned simulation resources and not in operation) are shown within dotted lines. The state of the distributed simulation system at three points in time are shown.

At the top of FIG. 15, the state of the distributed simulation system while the DCN1 12Q is in operation is shown. Thus, the DCN1 12Q, the hub 12P, and the DSNs 12N and 12O are active. The DCN2 12R and the DCN3 12S are inactive. The instruction code sequences corresponding to the DCN2 12R and the DCN3 12S, as well as any corresponding data structures, may be stored on carrier media awaiting activation.

After a hot pull command for DCN1 and a hot plug command for DCN2 (arrow 110), the state of the distributed simulation system may be as shown in the center of FIG. 15. In this case, the DCN2 12R is active and the DCN1 12Q and DCN3 12S are inactive. Thus, simulation resources used for the DCN1 12Q have been freed for other uses, and DCN2 12R has been assigned simulation resources. If the DCN1 12Q and the DCN2 12R used similar simulation resources, the resources allocated to the DCN1 12Q may be reallocated to the DCN2 12R.

After a hot pull command for DCN2 and a hot plug command for DCN3 (arrow 112), the state of the distributed simulation system may be as shown at the bottom of FIG. 15. In this case, the DCN3 12S is active and the DCN1 12Q and DCN2 12R are inactive. Thus, simulation resources used for the DCN2 12R have been freed for other uses, and DCN3 12S has been assigned simulation resources.

As FIG. 15 illustrates, simulation resources may be occupied for less than the total simulation time, and thus the simulation resources may be used for other purposes when not occupied (e.g. before a hot plug command and/or after a hot pull command).

Figure 16:
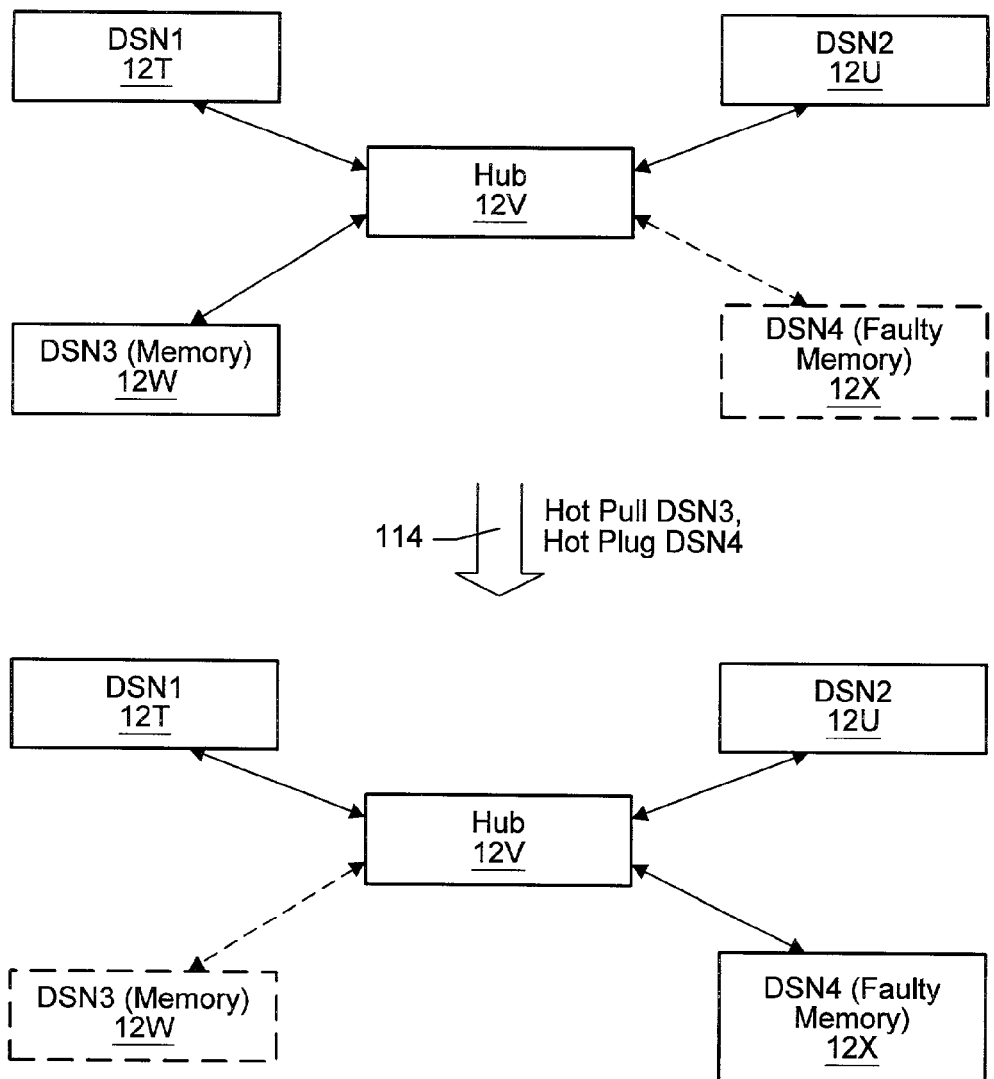
FIG. 16 is a block diagram illustrating an exemplary distributed simulation system and the use of hot plug and hot pull commands for error simulation.

Another example of the use of the hot plug and hot pull commands outside of simulating the hot plug or hot pull of a component of the system under test may be to substitute different models of a component into a simulation. Either static or dynamic embodiments of hot plugged/hot pulled nodes may be used in this case. For example, FIG. 16 illustrates a system in which a memory module is simulated using a first model in which the memory operates properly (DSN3 12W) and a second model in which the memory is faulty (DSN4 12X). At the beginning of the simulation (top of FIG.

16), the DSN3 12W may be active (along with two other DSNs 12T and 12U and a hub 12V). Thus, the simulation may progress with the memory module operating properly. At some point in the simulation, it may be desirable to introduce a memory error (e.g. to determine if error checking logic in the system under test detects the error). At that point (or prior to that point), a hot pull command may be executed to remove the DSN3 12W and a hot plug command may be executed to insert the DSN4 12X (arrow 114). Subsequently, the system may be as shown at the bottom of FIG. 16, with the DSN1 12T, the DSN2 12U, the hub 12V, and the DSN4 12X active (and the DSN3 12W inactive). A subsequent access to the faulty memory module modeled by the DSN4 12X may result in an error, and the error checking logic (e.g. in DSN1 12T or DSN2 12U) may be tested. While a model of correct operation and faulty operation are substituted in this example, other embodiments may substitute different models of correct operation, different faulty models, etc.

Figure 17:
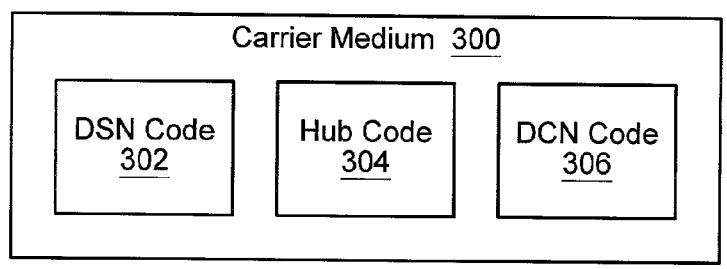
FIG. 17 is a block diagram of one embodiment of a carrier medium.

Turning next to FIG. 17, a block diagram of a carrier medium 300 is shown. Generally speaking, a carrier medium may include computer readable media such as storage media (which may include magnetic or optical media, e.g., disk or CD-ROM), volatile or non-volatile memory media such as RAM (e.g. SDRAM, RDRAM, SRAM, etc.), ROM, etc., as well as transmission media or signals such as electrical, electromagnetic, or digital signals, conveyed via a communication medium such as a network and/or a wireless link.

The carrier medium 300 is shown storing DSN code 302, hub code 304, and DCN code 306. The DSN code 302 may represent one or more code sequences implementing one or more of the flowcharts shown in FIGS. 5, 6, and/or 7. The hub code 304 may represent one or more code sequences implementing one or more of the flowcharts shown in FIGS. 3, 4, 8, and/or 9. The DCN code 306 may represent one or more code sequences to transmit a hot plug or hot pull command, a supplemental SCF command, or other test and monitoring functions. Any of the code 302, 304, and 306 may also include data structures used by the code (e.g. SCF commands or other data structures described herein). The carrier medium 300 as illustrated in FIG. 17 may represent multiple carrier media in multiple computer systems on which the distributed simulation system 10 executes.

Numerous variations and modifications will become apparent to those skilled in the art once the above disclosure is fully appreciated. It is intended that the following claims be interpreted to embrace all such variations and modifications.

What is claimed is:

1. A distributed simulation system comprising:
a first node configured to participate in a simulation of an electronic system under test, wherein the first node is configured to simulate a first component of the system under test;
a second node configured to transmit a hot pull command designating the first node, wherein the hot pull command indicates that a simulated hot pull of the first component from the system under test is to be performed, wherein a hot pull includes a removal of the first component from the system under test without removing power from the system under test; and
a hub coupled to the first node and the second node, wherein the hub is configured to terminate simulation execution in the first node and free simulation resources assigned to the first node responsive to the hot pull command and wherein, responsive to the hot pull command, the first node ceases participation in the simulation to simulate a removal of the first component from the system under test.

2. The distributed simulation system as recited in claim 1 further comprising a third node configured to simulate a second component coupled to the first component in the system under test.

3. The distributed simulation system as recited in claim 1 wherein the first node is configured to cease participating in the simulation by responding to any subsequent communications received by the first node with a no-operation command.

4. The distributed simulation system as recited in claim 1 wherein the first node is configured to cease participating in the simulation by terminating execution and freeing simulation resources assigned to the first node.

5. The distributed simulation system as recited in claim 1 wherein the hub is configured to cease forwarding communications from the first node responsive to the hot pull command from the second node.

6. The distributed simulation system as recited in claim 1 further comprising a control node configured to cease participation in the simulation responsive to a second hot pull command designating the control node.

7. The distributed simulation system as recited in claim 1 further comprising a third node, wherein the second node is configured to transmit a hot plug command designating the third node, and wherein the third node is configured to begin participating in the simulation responsive to the hot plug command.

8. The distributed simulation system as recited in claim 7 wherein the first node is configured to simulate a first model of the first component of the system under test, and wherein the third node is configured to simulate a second model of the first component.

9. The distributed simulation system as recited in claim 8 wherein the first model simulates correct operation of the first component and the second model simulates faulty operation of the first component.

10. A method comprising:
receiving a hot pull command designating a first node in a distributed simulation system that farther comprises a hub coupled to the first node, the first node configured to participate in a simulation and to simulate a first component of an electronic system under test in the simulation, wherein the hot pull command indicates that a simulated hot pull of the first component from the system under test is to be performed, wherein a hot pull includes a removal of the first component from the system under test without removing power from the system under test; and
ceasing participation of the first node in the simulation responsive to the hot pull command to simulate a removal of the first component from the system under test, wherein the ceasing participation comprises:
the hub terminating simulation execution in the first node responsive to the hot pull command; and
the hub freeing simulation resources assigned to the first node responsive to the hot pull command.

11. The method as recited in claim 10 wherein the ceasing participation comprises responding to any subsequent communications received by the first node with a no-operation command.

12. The method as recited in claim 10 wherein the ceasing participation comprises the hub ceasing forwarding communications from the first node responsive to the hot pull command.

13. The method as recited in claim 10 further comprising:
the hub pausing the simulation prior to terminating execution in the first node; and the hub resuming the simulation subsequent to the terminating execution and the freeing simulation resources.

14. The method as recited in claim 10 wherein the distributed simulation system further comprises a second node, the method further comprising:

transmitting a hot plug command designating the second node; and the second node beginning participation in the simulation responsive to the hot plug command.

15. The method as recited in claim 14 wherein the first node is configured to simulate a first model of the first component of the system under test, and wherein the third node is configured to simulate a second model of the first component.

16. The method as recited in claim 15 wherein the first model simulates correct operation of the first component and the second model simulates faulty operation of the first component.

17. One or more computer readable media comprising:

first instructions which, when executed, cease participation in a simulation by a first node in a distributed simulation system that further comprises a hub coupled to the first node, wherein the first node's participation in the simulation ceases responsive to receiving a hot pull command, the first node simulating a first component of an electronic system under test, and the first node ceasing participation in the simulation simulates removal of the first component from the system under test, wherein the hot pull command indicates that a simulated hot pull of the first component from the system under test is to be performed, wherein a hot pull includes a removal of the first component from the system under test without removing power from the system under test, and wherein the first instructions cease participation by:

causing the hub to terminate simulation execution in the first node responsive to the hot pull command; and causing the hub to free simulation resources assigned to the first node responsive to the hot pull command.

18. The computer readable media as recited in claim 17 further comprising:

second instructions which, when executed, transmit the hot pull command designating the first node.

19. The computer readable media as recited in claim 17 wherein the first instructions, when executed, include responding to any subsequent communications received by the first node with a no-operation command.

20. The computer readable media as recited in claim 17 wherein the distributed simulation system further comprises a hub coupled to the first node, and wherein the first instructions, when executed in the hub, cease participation by ceasing forwarding communications from the first node in the hub responsive to the hot pull command.

21. The computer readable media as recited in claim 17 wherein the distributed simulation system further comprises a second node, the carrier media further comprising third instructions which, when executed, transmit a hot plug command designating the second node; and cause the second node to begin participation in the simulation responsive to the hot plug command.

22. A distributed simulation system comprising:

a first node configured to participate in a simulation of an electronic system under test, the first node configured to simulate a first component of the system under test; and a second node configured to transmit a hot plug command designating the first node, wherein the hot plug command indicates that a simulated hot plug of the first component into the system under test is to be performed, wherein a hot plug includes an insertion of the first component into the system under test without removing power from the system under test;

wherein the first node does not participate in the simulation prior to the hot plug command, and wherein the first node begins participation in the simulation responsive to the hot plug command to simulate insertion of the first component in the system under test, and wherein the first node not participating in the simulation includes not executing the simulation in the first node and not assigning simulation resources to the first node prior to the hot plug command.

23. The distributed simulation system as recited in claim 22 further comprising a third node configured to simulate a second component coupled to the first component in the system under test.

24. The distributed simulation system as recited in claim 22 wherein the first node not participating in the simulation includes responding to any communications received by the first node with a no-operation command.

25. The distributed simulation system as recited in claim 22 wherein the first node is configured to begin participating in the simulation by responding to at least one communication with a communication other than a no-operation command.

26. The distributed simulation system as recited in claim 22 wherein the first node beginning participation in the simulation includes assigning simulation resources to the first node.

27. The distributed simulation system as recited in claim 26 wherein the first node beginning participation in the simulation further includes the first node coupling into the distributed simulation system.

28. A method comprising:

receiving a hot plug command designating a first node, the first node configured to participate in a simulation and to simulate a first component of an electronic system under test in the simulation; and the first node beginning participation in the simulation responsive to the hot plug command to simulate insertion of the first component into the system under test, wherein the hot plug command indicates that a simulated hot plug of the first component into the system under test is to be performed, wherein a hot plug includes an insertion of the first component into the system under test without removing power from the system under test;

wherein the first node does not participate in the simulation prior to the hot plug command, and wherein the first node not participating in the simulation includes not executing the simulation in the first node and not assigning simulation resources to the first node prior to the hot plug command.

29. The method as recited in claim 28 wherein the first node not participating in the simulation includes responding to any subsequent communications received by the first node with a no-operation command.

30. The method as recited in claim 28 wherein the first node beginning participation in the simulation comprises responding to at least one communication with a communication other than a no-operation command.

31. The method as recited in claim 28 wherein the first node beginning participation in the simulation includes assigning simulation resources to the first node.

32. The method as recited in claim 31 wherein the first node beginning participation in the simulation further includes the first node coupling into the distributed simulation system.

* * * * *